(12) United States Patent
Hatfield (10) Patent No.: US 10,529,356 B2
(45) Date of Patent: Jan. 7, 2020

(54) DETECTING UNWANTED AUDIO SIGNAL COMPONENTS BY COMPARING SIGNALS PROCESSED WITH DIFFERING LINEARITY

(71) Applicant: Cirrus Logic International Semiconductor Ltd., Edinburgh (GB)

(72) Inventor: Robert James Hatfield, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/980,491

(22) Filed: May 15, 2018

(65) Prior Publication Data

US 2019/0355380 A1    Nov. 21, 2019

(51) Int. Cl.
| | | |
|---|---|---|
| *G10L 25/51* | (2013.01) | |
| *H03G 3/20* | (2006.01) | |
| *H04R 1/40* | (2006.01) | |
| *H04R 29/00* | (2006.01) | |
| *H03G 3/00* | (2006.01) | |

(52) U.S. Cl.
CPC ............. *G10L 25/51* (2013.01); *H03G 3/001* (2013.01); *H03G 3/20* (2013.01); *H04R 1/406* (2013.01); *H04R 29/00* (2013.01); *H03G 2201/103* (2013.01)

(58) Field of Classification Search
CPC .......... G10L 25/51; H03G 3/001; H03G 3/20; H03G 2201/103; H04R 1/406; H04R 29/00
USPC .......................................................... 381/56
See application file for complete search history.

(56) References Cited

U.S. PATENT DOCUMENTS

| | | | |
|---|---|---|---|
| 5,568,559 A | * | 10/1996 | Makino .................. H03G 5/165 381/56 |
| 6,480,825 B1 | | 11/2002 | Sharma et al. |
| 7,016,833 B2 | | 3/2006 | Gable et al. |

(Continued)

FOREIGN PATENT DOCUMENTS

| | | |
|---|---|---|
| CN | 106297772 A | 1/2017 |
| CN | 106531172 A | 3/2017 |

(Continued)

OTHER PUBLICATIONS

International Search Report and Written Opinion of the International Searching Authority, International Application No. PCT/GB2018/053274, dated Jan. 24, 2019.

(Continued)

*Primary Examiner* — Vivian C Chin
*Assistant Examiner* — Douglas J Suthers
(74) *Attorney, Agent, or Firm* — Jackson Walker L.L.P.

(57) ABSTRACT

A method for determining the presence of unwanted signal components in an acoustic signal, comprises: receiving a first microphone signal derived from an acoustic signal, applying the first microphone signal to a first signal processing path having a first transfer function to provide a first output, receiving a second microphone signal derived from the acoustic signal, applying the second microphone signal to a second signal processing path having a second transfer function to provide a second output, wherein the second transfer function has a different degree of linearity from the first transfer function, and determining the presence of unwanted signal components in the acoustic signal based on a comparison of the first output and the second output.

17 Claims, 9 Drawing Sheets

(56) References Cited

U.S. PATENT DOCUMENTS

| | | |
|---|---|---|
| 8,489,399 B2 | 7/2013 | Gross |
| 8,856,541 B1 | 10/2014 | Chaudhury et al. |
| 9,171,548 B2 | 10/2015 | Velius et al. |
| 9,484,036 B2 | 11/2016 | Kons et al. |
| 9,646,261 B2 | 5/2017 | Agrafioti et al. |
| 10,079,024 B1 | 9/2018 | Bhimanaik et al. |
| 2002/0194003 A1 | 12/2002 | Mozer |
| 2004/0141418 A1 | 7/2004 | Matsuo et al. |
| 2005/0171774 A1 | 8/2005 | Applebaum et al. |
| 2007/0055517 A1 | 3/2007 | Spector |
| 2007/0129941 A1 | 6/2007 | Tavares |
| 2008/0071532 A1 | 3/2008 | Ramakrishnan et al. |
| 2009/0087003 A1 | 4/2009 | Zurek et al. |
| 2009/0105548 A1 | 4/2009 | Bart |
| 2009/0319270 A1 | 12/2009 | Gross |
| 2010/0004934 A1 | 1/2010 | Hirose et al. |
| 2010/0204991 A1 | 8/2010 | Ramakrishnan et al. |
| 2012/0110341 A1 | 5/2012 | Beigi |
| 2013/0289999 A1 | 10/2013 | Hymel |
| 2014/0188770 A1 | 7/2014 | Agrafioti et al. |
| 2015/0088509 A1 | 3/2015 | Gimenez et al. |
| 2015/0347734 A1 | 12/2015 | Beigi |
| 2015/0356974 A1 | 12/2015 | Tani et al. |
| 2016/0026781 A1 | 1/2016 | Boczek |
| 2016/0234204 A1 | 8/2016 | Rishi et al. |
| 2017/0011406 A1 | 1/2017 | Tunnell et al. |
| 2017/0078780 A1 | 3/2017 | Qian et al. |
| 2017/0116995 A1 | 4/2017 | Ady et al. |
| 2017/0169828 A1 | 6/2017 | Sachdev |
| 2017/0200451 A1 | 7/2017 | Bocklet et al. |
| 2017/0231534 A1 | 8/2017 | Agassy et al. |
| 2017/0351487 A1 | 12/2017 | Aviles-Casco Vaquero et al. |
| 2018/0060557 A1 | 3/2018 | Valenti et al. |
| 2018/0096120 A1 | 4/2018 | Boesen |
| 2018/0146370 A1 | 5/2018 | Krishnaswamy et al. |
| 2018/0232511 A1 | 8/2018 | Bakish |
| 2018/0239955 A1 | 8/2018 | Rodriguez et al. |
| 2018/0240463 A1 | 8/2018 | Perotti |
| 2018/0254046 A1 | 9/2018 | Khoury et al. |
| 2018/0336901 A1 | 11/2018 | Masaki et al. |
| 2018/0374487 A1 | 12/2018 | Lesso |
| 2019/0005963 A1 | 1/2019 | Alonso et al. |
| 2019/0005964 A1 | 1/2019 | Alonso et al. |
| 2019/0114496 A1 | 4/2019 | Lesso |
| 2019/0114497 A1 | 4/2019 | Lesso |
| 2019/0115030 A1 | 4/2019 | Lesso |
| 2019/0115032 A1 | 4/2019 | Lesso |
| 2019/0115033 A1 | 4/2019 | Lesso |
| 2019/0115046 A1 | 4/2019 | Lesso |
| 2019/0147888 A1 | 5/2019 | Lesso |
| 2019/0149932 A1 | 5/2019 | Lesso |
| 2019/0228778 A1 | 7/2019 | Lesso |
| 2019/0228779 A1 | 7/2019 | Lesso |

FOREIGN PATENT DOCUMENTS

| | | |
|---|---|---|
| EP | 1701587 A2 | 9/2006 |
| EP | 1928213 A1 | 6/2008 |
| EP | 2660813 A1 | 11/2013 |
| EP | 2860706 A2 | 4/2015 |
| EP | 3016314 A1 | 5/2016 |
| GB | 2499781 A | 9/2013 |
| GB | 2515527 A | 12/2014 |
| GB | 2551209 A | 12/2017 |
| GB | 2552723 A | 2/2018 |
| WO | 9834216 A2 | 8/1998 |
| WO | 02/103680 A2 | 12/2002 |
| WO | 2008113024 A1 | 9/2008 |
| WO | 2010066269 A1 | 6/2010 |
| WO | 2013022930 A1 | 2/2013 |
| WO | 2013154790 A1 | 10/2013 |
| WO | 2015163774 A1 | 10/2015 |
| WO | 2016003299 A1 | 1/2016 |
| WO | 2017055551 A1 | 4/2017 |

OTHER PUBLICATIONS

Beigi, Homayoon, "Fundamentals of Speaker Recognition," Chapters 8-10, ISBN: 978-0-378-77592-0; 2011.
Li, Lantian et al., "A Study on Replay Attack and Anti-Spoofing for Automatic Speaker Verification", Interspeech 2017, Jan. 1, 2017, pp. 92-96.
Li, Zhi et al., "Compensation of Hysteresis Nonlinearity in Magnetostrictive Actuators with Inverse Multiplicative Structure for Preisach Model", IEE Transactions on Automation Science and Engineering, vol. 11, No. 2, Apr. 1, 2014, pp. 613-619.
Partial International Search Report of the International Searching Authority, International Application No. PCT/GB2018/052905, dated Jan. 25, 2019.
Combined Search and Examination Report, UKIPO, Application No. GB1713699.5, dated Feb. 21, 2018.
Combined Search and Examination Report, UKIPO, Application No. GB1713695.3, dated Feb. 19, 2018.
Zhang et al., An Investigation of Deep-Learing Frameworks for Speaker Verification Antispoofing—IEEE Journal of Selected Topics in Signal Processes, Jun. 1, 2017.
Combined Search and Examination Report under Sections 17 and 18(3), UKIPO, Application No. GB1804843.9, dated Sep. 27, 2018.
Wu et al., Anti-Spoofing for text-Independent Speaker Verification: An Initial Database, Comparison of Countermeasures, and Human Performance, IEEE/ACM Transactions on Audio, Speech, and Language Processing, Issue Date: Apr. 2016.
International Search Report and Written Opinion of the International Searching Authority, International Application No. PCT/GB2018/051760, dated Aug. 3, 2018.
International Search Report and Written Opinion of the International Searching Authority, International Application No. PCT/GB2018/051787, dated Aug. 16, 2018.
International Search Report and Written Opinion of the International Searching Authority, International Application No. PCT/GB2018/052907, dated Jan. 15, 2019.
Ajmera, et al,, "Robust Speaker Change Detection," IEEE Signal Processing Letters, vol. 11, No. 8, pp. 349-651, Aug. 2004.
Combined Search and Examination Report under Sections 17 and 18(3), UKIPO, Application No. GB1803570.9, dated Aug. 21, 2018.
International Search Report and Written Opinion of the International Searching Authority, International Application No. PCT/GB2018/051765, dated Aug. 16, 2018.
Combined Search and Examination Report under Sections 17 and 18(3), UKIPO, Application No. GB1801661.8, dated Jul. 30, 2018.
Combined Search and Examination Report under Sections 17 and 18(3), UKIPO, Application No. GB1801663.4, dated Jul. 18, 2018.
Combined Search and Examination Report under Sections 17 and 18(3), UKIPO, Application No. GB1801684.2, dated Aug. 1, 2018.
Combined Search and Examination Report under Sections 17 and 18(3), UKIPO, Application No. GB1719731.0, dated May 16, 2018.
Combined Search and Examination Report, UKIPO, Application No. GB1801874.7, dated Jul. 25, 2018.
Combined Search and Examination Report under Sections 17 and 18(3), UKIPO, Application No. GB1801659.2, dated Jul. 26, 2018.
International Search Report and Written Opinion of the International Searching Authority, International Application No. PCT/GB2018/052906, dated Jan. 14, 2019.
Further Search Report under Sections 17 (6), UKIPO, Application No. GB1719731.0, dated Nov. 26, 2018.
Combined Search and Examination Report, UKIPO, Application No. GB1713697.9, dated Feb. 20, 2018.
Villalba, Jesus et al., Preventing Replay Attacks on Speaker Verification Systems, International Carnahan Conference on Security Technology (ICCST), 2011 IEEE, Oct. 18, 2011, pp. 1-8.
Chen et al., "You Can Hear But You Cannot Steal: Defending Against Voice Impersonation Attacks on Smartphones", Proceedings of the International Conference on Distributed Computing Systems, PD: Jun. 5, 2017.
Combined Search and Examination Report under Sections 17 and 18(3), UKIPO, Application No. GB1809474.8, dated Jul. 23, 2018.
International Search Report and Written Opinion of the International Searching Authority, International Application No. PCT/

(56) References Cited

OTHER PUBLICATIONS

GB2019/050185, dated Apr. 2, 2019.
International Search Report and Written Opinion of the International Searching Authority, International Application No. PCT/GB2019/052143, dated Sep. 17, 2019.
International Search Report and Written Opinion, International Application No. PCT/GB2019/052302, dated Oct. 2, 2019.

* cited by examiner

DETECTING UNWANTED AUDIO SIGNAL COMPONENTS BY COMPARING SIGNALS PROCESSED WITH DIFFERING LINEARITY

TECHNICAL FIELD

This relates to an audio signal processing system, and in particular to a system for detecting the presence of out-of-band components in a received signal.

BACKGROUND

In an audio signal processing system, elements within the signal processing paths, such as audio amplifiers, or signal converters, will often display nonlinear characteristics. Because of this, there is a possibility that received signals at frequencies outside the audio band will be downconverted or mixed down to frequencies within the audio band. In some situations, this can impact on downstream system performance of speech recognition systems or speaker recognition systems. These out-of-band signals may be generated innocently, for example in ultrasonic transmitters used as distance sensors, or in ultrasonic communication systems, or even when metal objects such as coins or keys are brought into contact with each other. However, it is also possible that out-of-band signals may be generated deliberately in an attempt to maliciously affect system performance, for example as part of an injection attack or a denial-of-service attack.

SUMMARY OF THE INVENTION

According to an aspect of the invention, there is provided a method for determining the presence of unwanted signal components in an acoustic signal, comprising:
  receiving a first microphone signal derived from an acoustic signal,
  applying the first microphone signal to a first signal processing path having a first transfer function to provide a first output,
  receiving a second microphone signal derived from the acoustic signal,
  applying the second microphone signal to a second signal processing path having a second transfer function to provide a second output, wherein the second transfer function has a different degree of linearity from the first transfer function, and
  determining the presence of unwanted signal components in the acoustic signal based on a comparison of the first output and the second output.

According to a second aspect of the invention, there is provided an analog front end, comprising: at least one input, a first signal processing path connected to an input for receiving a first microphone signal derived from an acoustic signal, wherein the first signal processing path has a first transfer function and provides a first output, a second signal processing path connected to an input for receiving a second microphone signal derived from the acoustic signal, wherein the second signal processing path has a second transfer function and provides a second output, and wherein the second transfer function has a different degree of linearity from the first transfer function, and a comparator for determining a presence of unwanted signal components in the acoustic signal based on a comparison of the first output and the second output.

The comparator may determine the presence of unwanted signal components in the acoustic signal by detecting signal components within the first output which are absent from the second output.

The comparator may determine the presence of unwanted signal components in the acoustic signal by detecting signal components within an audio band frequency range of the first output which are absent from the audio band frequency range of the second output.

The second transfer function may have greater linear range of operation than the first transfer function. The first and second signal processing paths may be configurable such that the second transfer function has a greater linear range of operation than the first transfer function. Configuring the first and second signal processing paths may comprise adjusting a gain value of a gain circuit provided in at least one of the first and second signal processing paths.

The first and second signal processing paths may each comprise an analog gain element and a digital gain element, and configuring the first and second signal processing paths may comprise setting total gain values of the first and second signal processing paths to be equal, and setting a gain value of the analog gain element in the first signal processing path to be higher than a gain value of the analog gain element in the second signal processing path.

The first and second signal processing paths may comprise at least one signal processing component having nonlinear characteristics, and configuring the first and second signal processing paths may comprise adjusting the operation of at least one signal processing component having nonlinear characteristics.

The at least one signal processing component may comprise an analog amplifier, and configuring the first and second signal processing paths may comprise adjusting a gain of the analog amplifier.

The at least one signal processing component may comprise an analog-to-digital converter, and configuring the first and second signal processing paths may comprise adjusting a gain of the analog-to-digital converter.

The first and second signal processing paths may be configurable by applying different supply voltages to the first and second signal processing paths.

The first and second signal processing paths may be configurable by applying a DC offset to one of the first and second signal processing paths.

The first microphone signal and the second microphone signal may be received at the same microphone input.

The first microphone signal and the second microphone signal may be received at different microphone inputs.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

For clarity, it will be noted here that this description refers to speaker recognition and to speech recognition, which are intended to have different meanings. Speaker recognition refers to a technique that provides information about the identity of a person speaking. For example, speaker recognition may determine the identity of a speaker, from amongst a group of previously registered individuals (speaker identification), or may provide information indicating whether a speaker is or is not a particular individual (speaker verification), for example for the purposes of authentication. Speech recognition refers to a technique for determining the content and/or the meaning of what is spoken, rather than recognising the person speaking.

Figure 1:
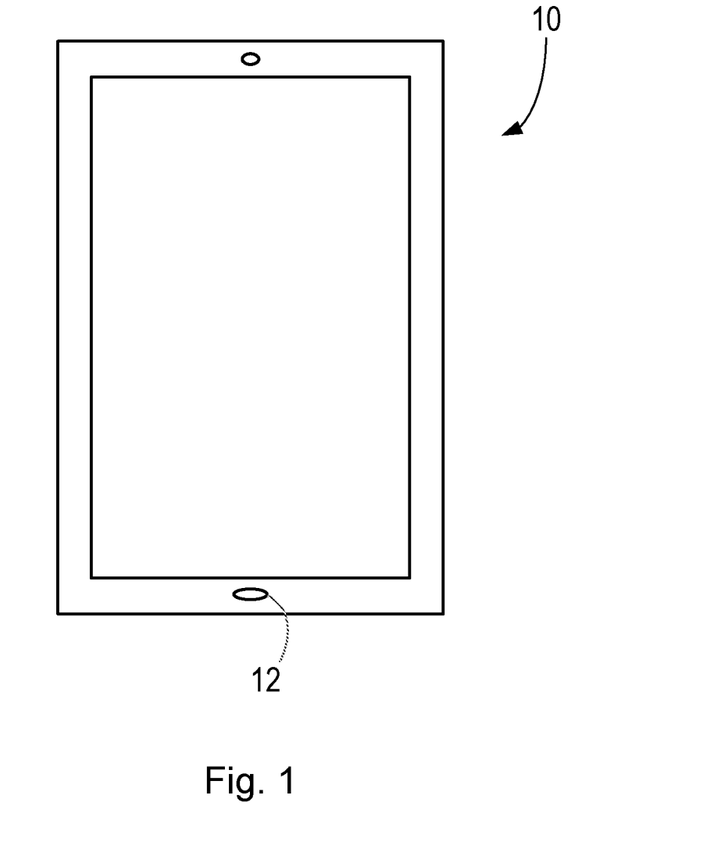
FIG. 1 shows a smartphone.

FIG. 1 illustrates a smartphone 10, having a microphone 12 for detecting ambient sounds.

Figure 2:
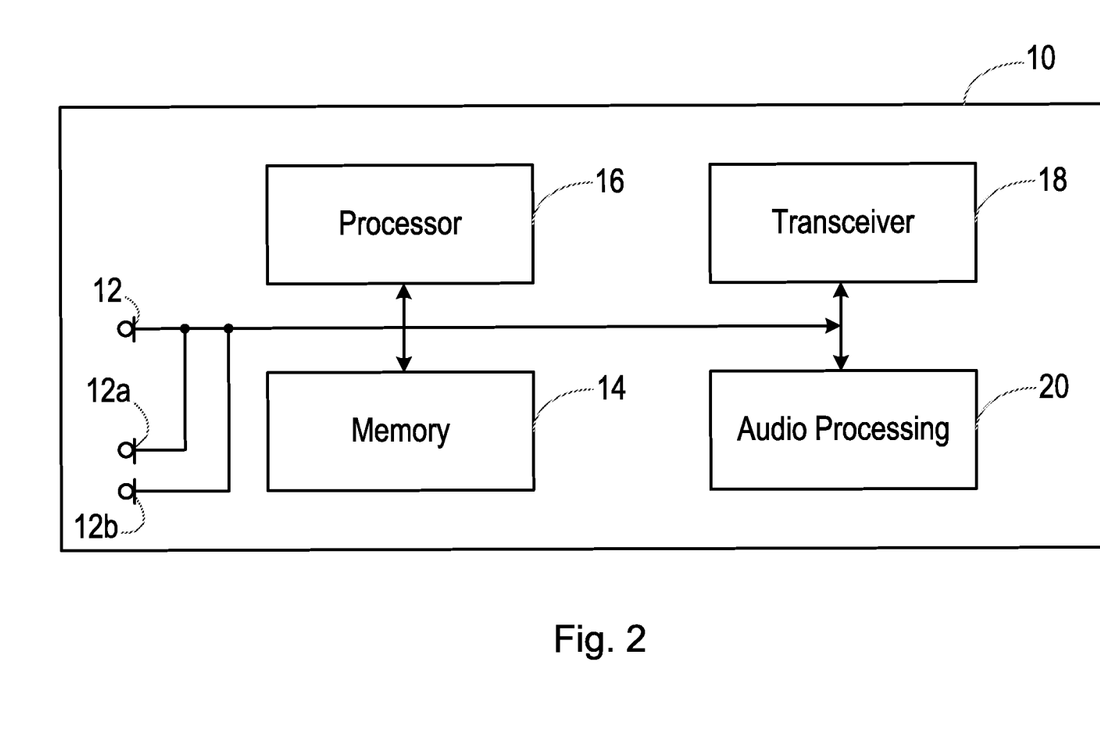
FIG. 2 is a schematic diagram of the smartphone.

FIG. 2 is a schematic diagram, illustrating the form of the smartphone 10.

Specifically, FIG. 2 shows various interconnected components of the smartphone 10. It will be appreciated that the smartphone 10 will in practice contain many other components, but the following description is sufficient for an understanding of the present invention.

Thus, FIG. 2 shows the microphone 12 mentioned above. In certain embodiments, the smartphone 10 is provided with multiple microphones 12, 12a, 12b, etc.

FIG. 2 also shows a memory 14, which may in practice be provided as a single component or as multiple components. The memory 14 is provided for storing data and program instructions.

FIG. 2 also shows a processor 16, which again may in practice be provided as a single component or as multiple components. For example, one component of the processor 16 may be an applications processor of the smartphone 10.

FIG. 2 also shows a transceiver 18, which is provided for allowing the smartphone 10 to communicate with external networks. For example, the transceiver 18 may include circuitry for establishing an internet connection either over a WiFi local area network or over a cellular network.

FIG. 2 also shows audio processing circuitry 20, for performing operations on the audio signals detected by the microphone 12 as required. For example, the audio processing circuitry 20 may filter the audio signals or perform other signal processing operations.

In this embodiment, the smartphone 10 is provided with speaker recognition functionality, and with control functionality. Thus, the smartphone 10 is able to perform various functions in response to spoken commands from an enrolled user. The speaker recognition functionality is able to distinguish between spoken commands from an enrolled user, and the same commands when spoken by a different person. Thus, certain embodiments of the invention relate to operation of a smartphone or another portable electronic device with some sort of voice operability, for example a tablet or laptop computer, a games console, a home control system, a home entertainment system, an in-vehicle entertainment system, a domestic appliance, or the like, in which the speaker recognition functionality is performed in the device that is intended to carry out the spoken command. Certain other embodiments relate to systems in which the speaker recognition functionality is performed on a smartphone or other device, which then transmits the commands to a separate device if the speaker recognition functionality is able to confirm that the speaker was an enrolled user.

In some embodiments, while speaker recognition functionality is performed on the smartphone 10 or other device that is located close to the user, the spoken commands are transmitted using the transceiver 18 to a remote speech recognition system, which determines the meaning of the spoken commands. For example, the speech recognition system may be located on one or more remote server in a cloud computing environment. Signals based on the meaning of the spoken commands are then returned to the smartphone 10 or other local device.

In other embodiments, a first part of the speaker recognition functionality is performed on the smartphone 10 or other device that is located close to the user. Then, as described in more detail below, a signal may be transmitted using the transceiver 18 to a remote system, which performs a second part of the speaker recognition functionality.

Figure 3:
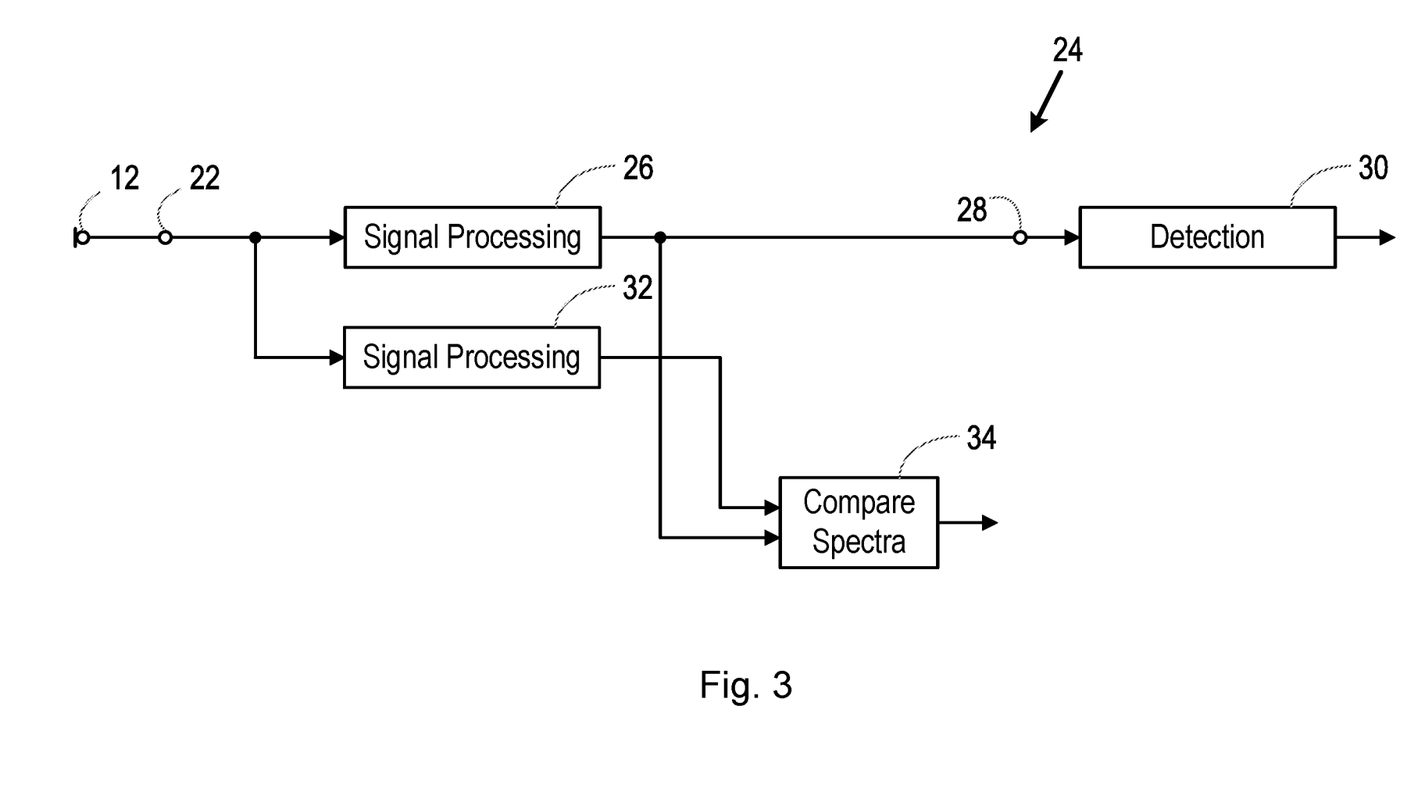
FIG. 3 is a block diagram, illustrating a part of an audio signal processing system.
Figure 4:
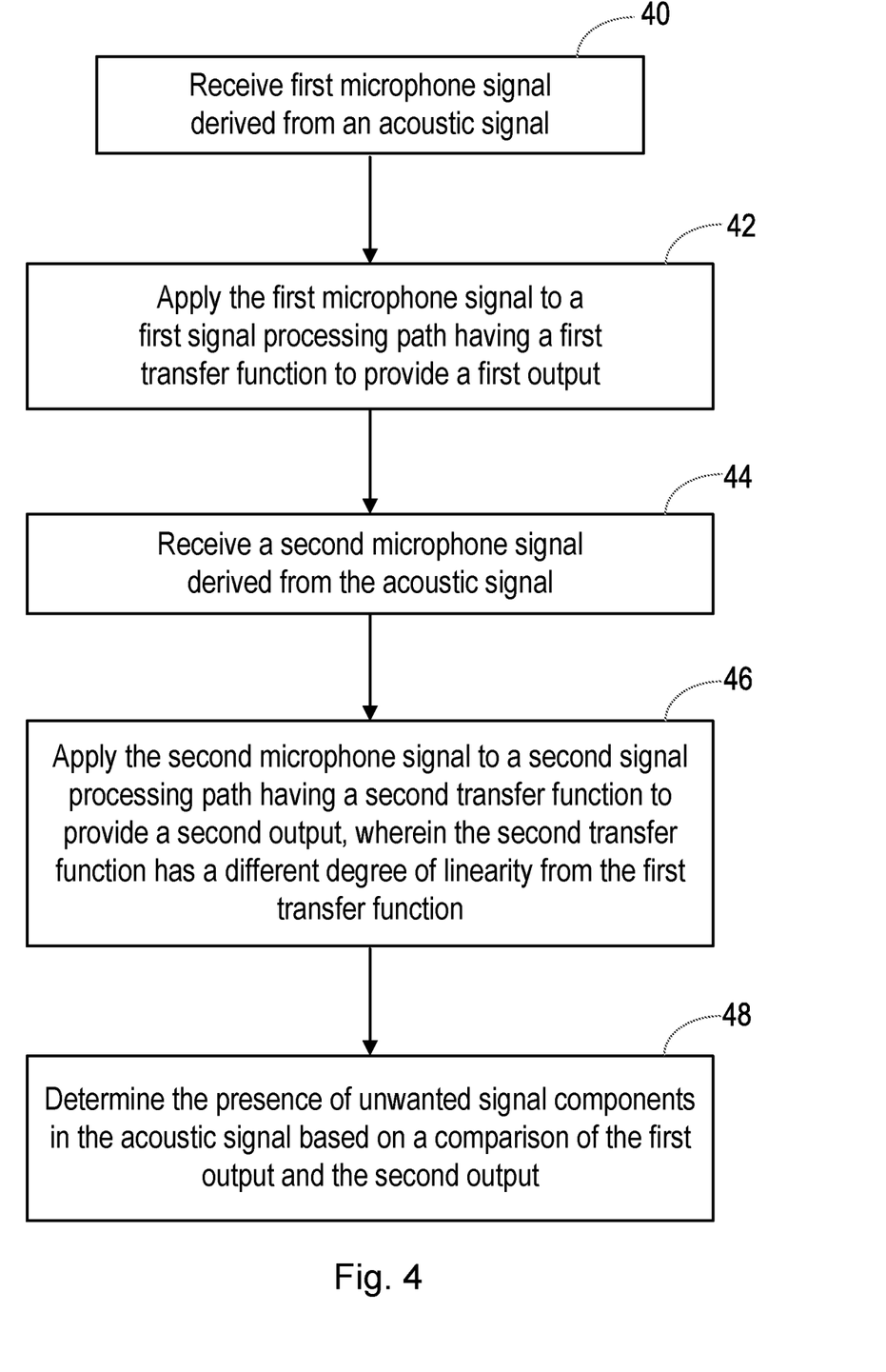
FIG. 4 is a flow chart, illustrating a method of audio signal processing.

FIG. 3 illustrates a part of an audio signal processing system, and FIG. 4 is a flow chart illustrating a corresponding method of signal processing, for detecting unwanted components of the signal.

A microphone 12 of the smartphone 10 generates a signal when it detects sound. The signal generated by the microphone 12 is passed to an input terminal 22 of pre-processing circuitry 24. In other embodiments, the pre-processing circuitry 24 may be located in a different device from the microphone. For example, in the case of wired or wireless headsets or other accessories, a signal from a microphone provided in the headset may be applied to pre-processing circuitry 24 in a host device such as a smartphone.

Thus, as shown at step 40 in FIG. 4, the signal generated by the microphone forms a first microphone signal. As shown at step 42, this first microphone signal is applied to a first signal processing path 26, which has a first transfer function, to provide a first output. The first output is passed to an output terminal 28 of the pre-processing circuitry 24.

The signal output on the output terminal 28 may then, for example, be passed to a detection block, such as a voice trigger detection block 30. In this illustrated embodiment, the voice trigger detection block 30 attempts to determine whether the signal received from the microphone 12 represents a specific predetermined trigger phrase, such as "OK, phone", which must be spoken by a user of the device in order to activate a speech recognition operation.

One problem that can arise in the operation of such a system is that elements within the signal processing path 26 will often display nonlinear characteristics. Because of this, there is a possibility that received signals at frequencies outside the audio band will be downconverted or mixed down to frequencies within the audio band. In some situations, this can impact on the performance of blocks such as the voice trigger detection block 30 or subsequent speech recognition systems or speaker recognition systems.

These out-of-band signals may be generated innocently, for example in ultrasonic transmitters used as distance sensors, or in ultrasonic communication systems, or even when metal objects such as coins or keys are brought into contact with each other. However, it is also possible that out-of-band signals may be generated deliberately in an attempt to maliciously affect system performance, for example as part of an injection attack or a denial-of-service attack. For example, one possible attack involves a malicious third party generating an ultrasound signal that, when detected by the microphone 12 and passed to the signal processing path 26, is mixed down to the audio band, and generates an audio band signal that corresponds to the signal that is produced by a person speaking the predetermined trigger phrase. Such an attack is difficult to detect, because the ultrasound signal that is generated by the malicious third party is not directly detectable by a person.

Thus, in this illustrated embodiment, as shown at step 44 in FIG. 4, the signal on the input terminal 22 of the pre-processing circuitry 24 is split to form a second microphone signal derived from the acoustic signal.

As shown at step 46, this second microphone signal is applied to a second signal processing path 32, which has a second transfer function, to provide a second output.

As shown at step 48 in FIG. 4, the first output and the second output are passed to a comparison block 34, and the presence of unwanted signal components in the acoustic signal is determined based on a comparison of the first output and the second output.

Figure 5:
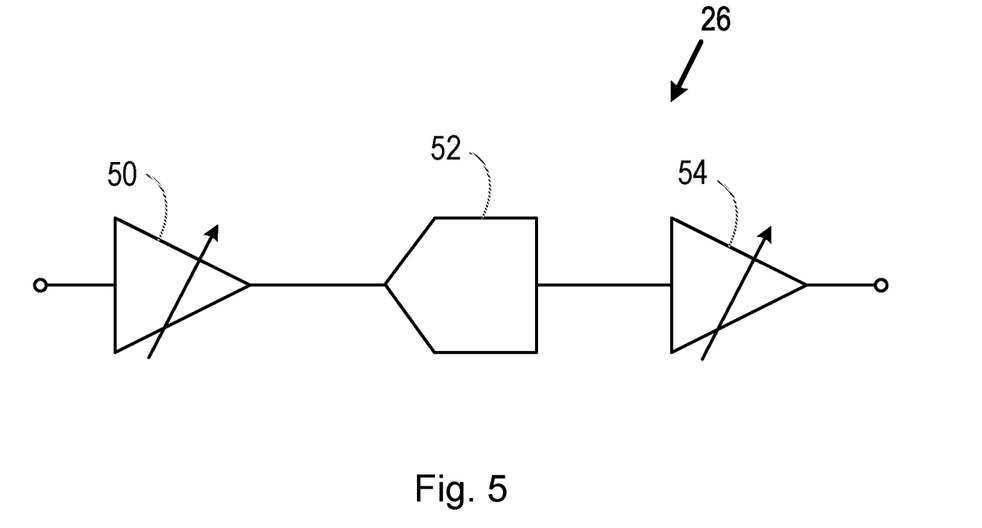
FIG. 5 illustrates a part of the system of FIG. 3.

FIG. 5 shows the form of the first signal processing path 26. Thus, the first signal processing path 26 comprises a first analog amplifier 50, with a programmable gain, an analog-to-digital converter 52, and a second digital amplifier 54, which has a controllable gain.

Figure 6:
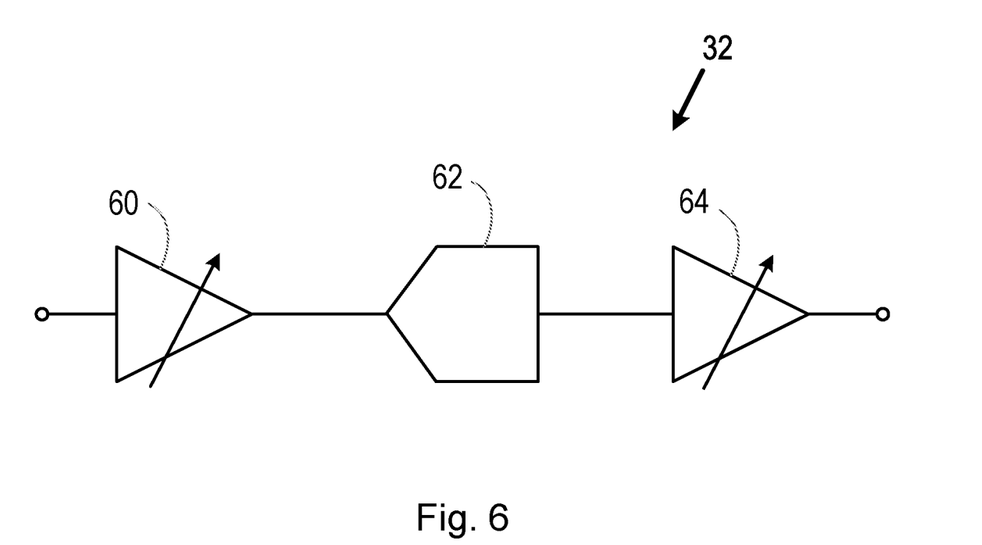
FIG. 6 illustrates a part of the system of FIG. 3.

FIG. 6 shows the form of the second signal processing path 32. Thus, the second signal processing path 32 comprises a first analog amplifier 60, with a programmable gain, an analog-to-digital converter 62, and a second digital amplifier 64, which has a controllable gain.

In the illustrated embodiment, the programmable gain of the analog amplifier 50, the controllable gain of the digital amplifier 54, the programmable gain of the analog amplifier 60, and the controllable gain of the digital amplifier 64 are controlled so that the second signal processing path 32 has the same overall gain as the first signal processing path 26, but the second transfer function has a different degree of linearity from the first transfer function. The degree of linearity may refer to the frequency range over which the transfer function is linear, or to the range of input signal levels that can be handled in a linear manner, for example.

In some embodiments, the gains of the analog-to-digital converters 52, 62 are also controllable to some degree. In such embodiments, these are taken into account when setting the gains of the analog amplifiers 50, 60 and the digital amplifiers 54, 64, so that the second signal processing path 32 has the same overall gain as the first signal processing path 26.

In some embodiments, the second transfer function has a different degree of linearity from the first transfer function in the sense that it has a greater linear range of operation than the first transfer function.

For example, in one possible configuration, the programmable gain of the analog amplifier 50 is set to 18 dB, and the controllable gain of the digital amplifier 54 is set to 0 dB. Meanwhile, the programmable gain of the analog amplifier 60 is set to 6 dB, and the controllable gain of the digital amplifier 64 is set to 12 dB. Thus, the overall gain (18 dB=18 dB+0 dB) of the second signal processing path 32 is the same as the overall gain (18 dB=6 dB+12 dB) of the first signal processing path 26.

Setting the programmable gain of the analog amplifier 50 in the signal path to a relatively high value is generally preferred, because this maintains a good signal-to-noise ratio at the output, and ensures that subsequent processes, such as the voice trigger detection performed by the voice trigger detection block 30, are not degraded by noise.

However, a common cause of nonlinearities in a signal processing path is distortion in a programmable gain analog amplifier when the input signal is large and/or the programmable gain of the analog amplifier is set to a high value. Thus, in this specific numerical example, setting the programmable gain of the analog amplifier 50 to the high value of 18 dB means that the analog amplifier 50 is more likely to be operating in its non-linear region when it receives a particular input signal, and so the second transfer function has a different degree of linearity from the first transfer function.

In other embodiments, the first signal processing path 26 comprises an analog amplifier with a fixed gain, an analog-to-digital converter, and a digital amplifier with a fixed gain, while the second signal processing path comprises an analog amplifier with a fixed gain, an analog-to-digital converter, and a digital amplifier with a fixed gain. The gain values may be set such that the second signal processing path 32 has the same overall gain as the first signal processing path 26, but the transfer function of the second signal processing path 32 has a different degree of linearity from the transfer function of the first signal processing path, because the balance between the analog and digital gains is different in the two signal processing paths.

For example, in one possible configuration, as in the situation described above with programmable and controllable gains, the gain of the analog amplifier in the first signal processing path 26 is set to 18 dB, and the gain of the digital amplifier in the first signal processing path 26 is set to 0 dB. Meanwhile, the gain of the analog amplifier in the second signal processing path 32 is set to 6 dB, and the gain of the digital amplifier in the second signal processing path 32 is set to 12 dB. Thus, the overall gain (18 dB=18 dB+0 dB) of the second signal processing path 32 is the same as the overall gain (18 dB=6 dB+12 dB) of the first signal processing path 26, but the two signal processing paths will have different degrees of linearity.

In still further embodiments, the components in the first signal processing path 26 and in the second signal processing path 32 are similar or identical, but different supply voltages are applied to them, and this alters the degrees of linearity.

In still further embodiments, the components in the first signal processing path 26 and in the second signal processing path 32 are similar or identical, but a DC offset is applied to one of them, so that the two signal processing paths have different degrees of linearity.

One effect of the different degrees of linearity is that, between the two signal processing paths 26, 32, there will be different degrees of distortion, and therefore different degrees to which the respective input signals are mixed down into the audio band.

The function of the comparison block 34 is therefore to compare the first output and the second output from the first and second signal processing paths 26, 32 respectively, and to determine whether there is a significant difference between them. If there is a significant difference, the presence of unwanted signal components in the original acoustic signal may be inferred, as shown at step 48 in FIG. 4.

For example, the comparison block 34 may compare the energy in one particular frequency band of the first output with the energy in the same frequency band of the second output. For example, the frequency band in which the energy is compared may comprise all or part of the audio frequency band (for example from 100 Hz to 20 kHz). In order to make this comparison, the comparison block 34 may include a Fast Fourier Transform (FFT) block, to extract frequency-domain parameters of the first and second outputs from the first and second signal processing paths 26, 32 when they are received at the comparison block 34. Then, the comparison block 34 may form the weighted sum of certain bins of the FFT output generated in response to each of the first output and the second output, and compare these results. More specifically, the comparison may involve measuring and comparing the power levels in one or more frequency bands between the two signal processing paths. Alternatively, the comparison may involve measuring a difference between the shapes of the signal power spectra in the two signal processing paths.

If the output from the signal processing path with the higher degree of distortion contains a higher level of energy in the selected frequency band, this can be used to infer that there was an unwanted component, for example a potentially disturbing ultrasound component, in the original input signal. For example, it may be inferred that there was an unwanted component if the difference between the levels of energy in the selected frequency band between the two signal processing paths exceeds 20%, or exceeds 30%, or exceeds 50%.

A further alternative is to send the outputs of the two signal processing paths 26, 32 to separate Voice Triggers (VTs) or to separate Voice Activity Detectors (VADs), for example high-gain path VTs or VADs that are tuned for high-gain operation). The VTs/VADs will generally output a value e.g. between 0.0-1.0, and the outputs of the different VTs or VADs can be compared. If the difference between the outputs is greater than a threshold (for example a 10% difference, or a 20% difference, or a 30% difference, or a 50% difference, the presence of unwanted signal components in the original acoustic signal may be inferred, as shown at step 48 in FIG. 4.

In any of these cases, where the presence of unwanted signal components in the original acoustic signal may be inferred, an output signal can be generated. For example, the output signal can be a flag that is sent to the voice trigger detection block 30, warning that the input signal may contain a dangerous ultrasound component and hence should not be trusted.

Figure 7:
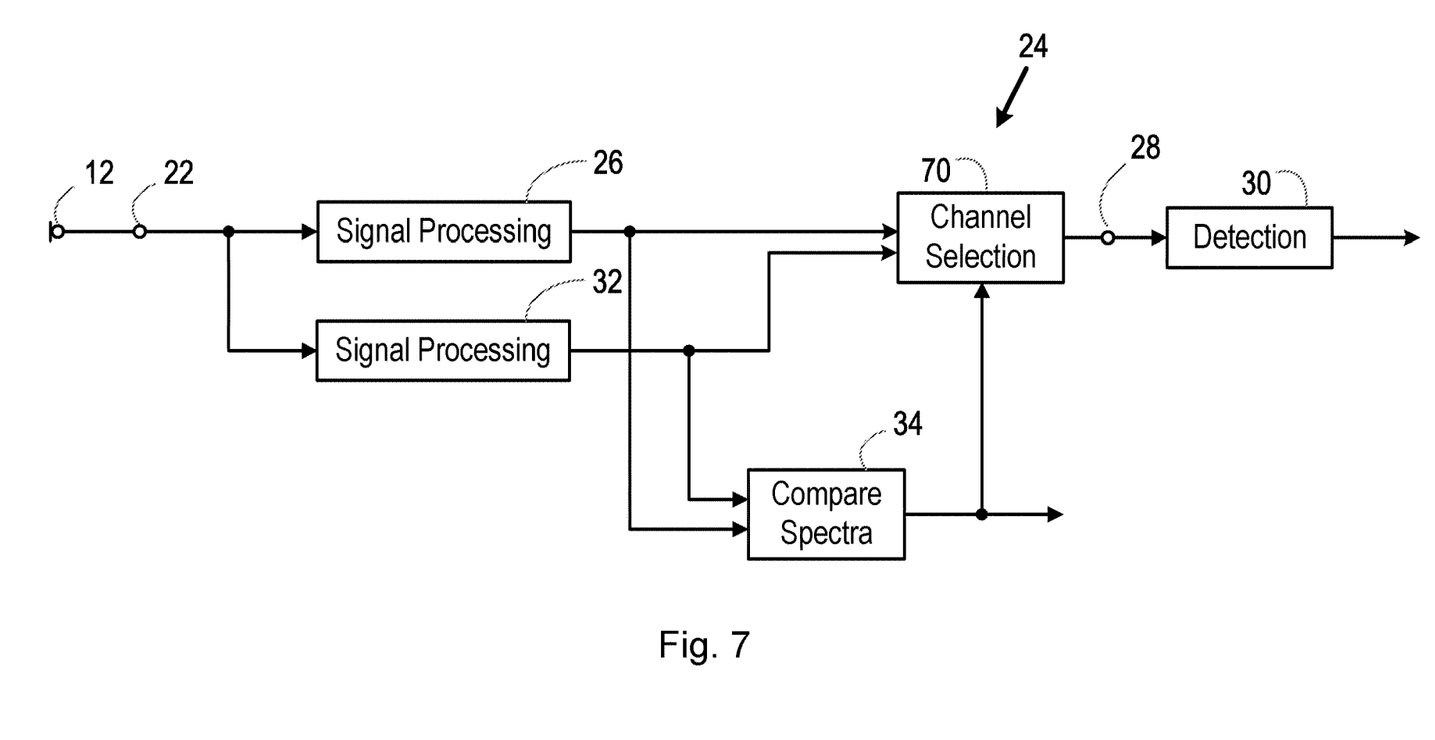
FIG. 7 is a block diagram, illustrating a part of an alternative audio signal processing system.

FIG. 7 illustrates an alternative embodiment of a part of an audio signal processing system. The system shown in FIG. 7 is generally the same as the system shown in FIG. 3, and parts of the system that are the same are indicated by the same reference numerals in FIG. 3 and FIG. 7. The operation of the system shown in FIG. 7 is generally the same as the operation of the system shown in FIG. 3, and the description thereof will not be repeated.

The system shown in FIG. 7 additionally includes a channel selection block 70. The first output, from the first signal processing path 26, and the second output, from the second signal processing path 32, are both passed to the channel selection block 70.

Based on a control signal generated by the comparison block 34, the channel selection block 70 determines which of the first output and the second output is passed to the voice trigger detection block 30. The channel selection block 70 may determine that only one of the first output and the second output is passed to the voice trigger detection block 30, or that some combination of the first output and the second output is passed to the voice trigger detection block 30.

The comparison block 34 may generate the control signal based on the result of the comparison of the first output, from the first signal processing path 26, and the second output, from the second signal processing path 32.

For example, as mentioned above, it is generally preferred that the signal processing path should have a relatively high analog gain, and a relatively low digital gain, in order to obtain the best possible signal-to-noise ratio. However, the signal processing path that has the higher analog gain will have a narrower linear range than the signal processing path with the lower analog gain. Therefore, in the presence of an ultrasound source, the output of the signal processing path that has the higher analog gain may contain energy in the selected frequency band that is not present in the selected frequency band of the output of the signal processing path that has the lower analog gain. This energy may have a disturbing effect on the voice trigger detection block 30, or any other function that is connected to the output 28 of the pre-processing circuitry 24.

Therefore, the operation of the comparison block 34 may be that, when the output of the signal processing path that has the higher analog gain contains energy in the selected frequency band that is not present in the selected frequency band of the output of the signal processing path that has the lower analog gain, it is the output of the signal processing path that has the lower analog gain that is passed through by the channel selection block 70. However, when the output of the signal processing path that has the higher analog gain does not contain excessive energy in the selected frequency band compared with the output of the signal processing path that has the lower analog gain, it is the output of the signal processing path that has the higher analog gain that is passed through by the channel selection block 70, in order to maintain the optimum signal-to-noise ratio.

In any event, the outputs of the two signal processing paths 26, 32 may both be buffered so that, whichever of them is passed through by the channel selection block 70, an entire utterance (for example an entire sentence of speech, for example including a trigger phrase and a command) may be sent as one complete unbroken stream to the downstream host system.

In other embodiments, the comparison block 34 may send a warning signal to a host system, or any downstream processing blocks, if it detects the presence of unwanted components in the input signal, regardless of whether it also controls the operation of the channel selection block 70.

In still further embodiments, the comparison block 34 may operate such that it makes any suitable comparison between the outputs of the two signal processing paths 26, 32. On the basis of the comparison, the comparison block 34 may send a control signal to the channel selection block 70 such that a specific one of the outputs (or a specific combination of the outputs) is passed through for downstream processing, regardless of whether the system detects the presence of unwanted components in the input signal.

Figure 8:
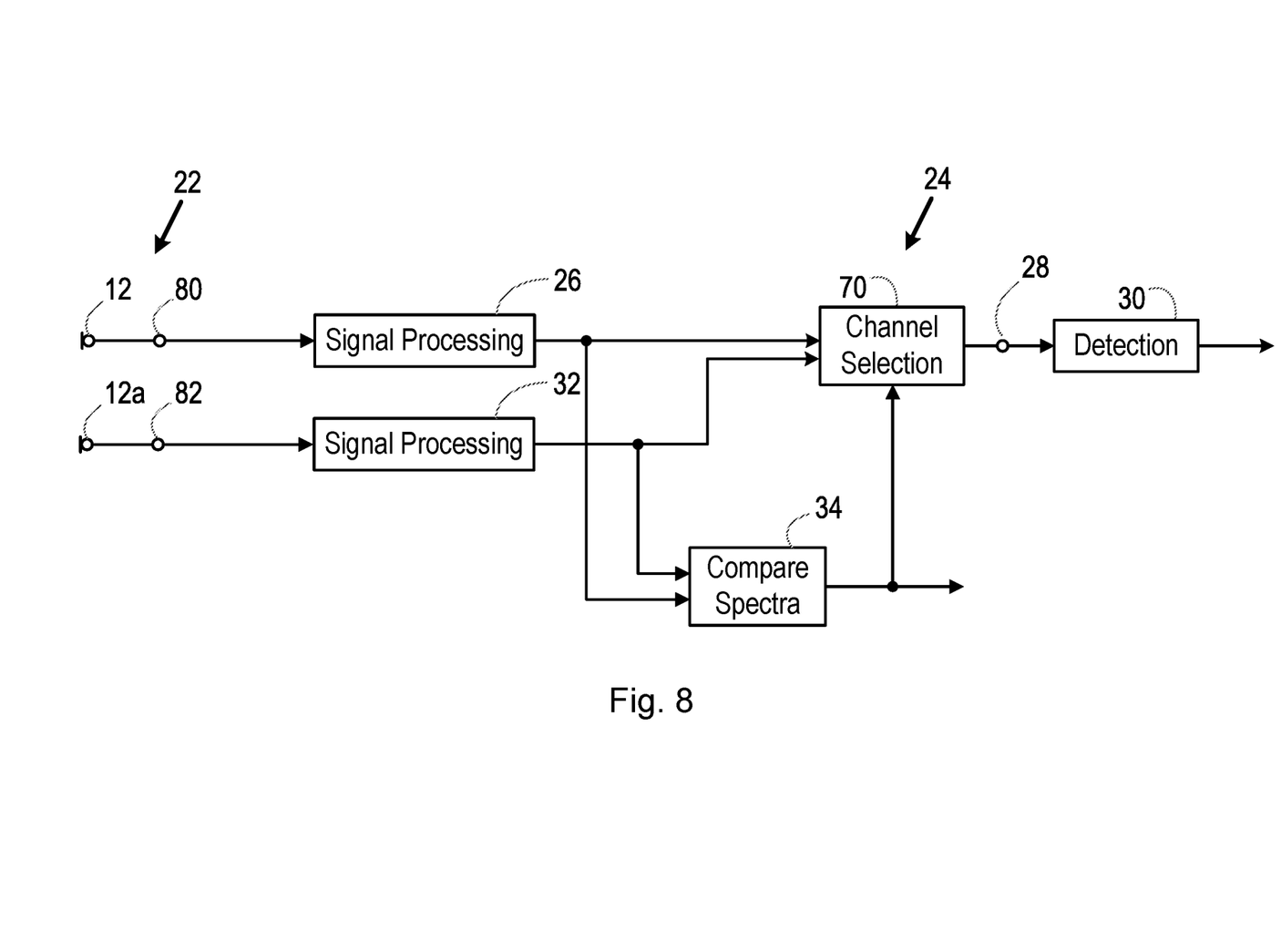
FIG. 8 is a block diagram, illustrating a part of an alternative audio signal processing system.

FIG. 8 illustrates an alternative embodiment of a part of an audio signal processing system. The system shown in FIG. 8 is generally the same as the system shown in FIG. 7, and parts of the system that are the same are indicated by the same reference numerals in FIG. 7 and FIG. 8. The operation of the system shown in FIG. 8 is generally the same as the operation of the system shown in FIG. 7, and the description thereof will not be repeated.

In the system shown in FIG. 8, the input 22 comprises a first input terminal 80 and second input terminal 82. A first microphone 12 may be connected to the first input terminal 80 and a second microphone 12a may be connected to the second input terminal 82.

Thus, the input signal to the first signal processing path 26 is not identical to the input to the second signal processing path 32.

This allows the comparison block 34 to test for additional effects. For example, if the microphones 12, 12a are provided at different locations on a device such as the smartphone 10, then in some situations one or other of the microphones will be occlude, for example because of the way in which the user is holding the device or because of where the user has put the device. In such situations, the comparison performed by the comparison block 34 may identify the occlusion, and may then selected the signal from the non-occluded microphone to be passed to the voice trigger detection block 30, or any other function that is connected to the output 28 of the pre-processing circuitry 24.

Figure 9:
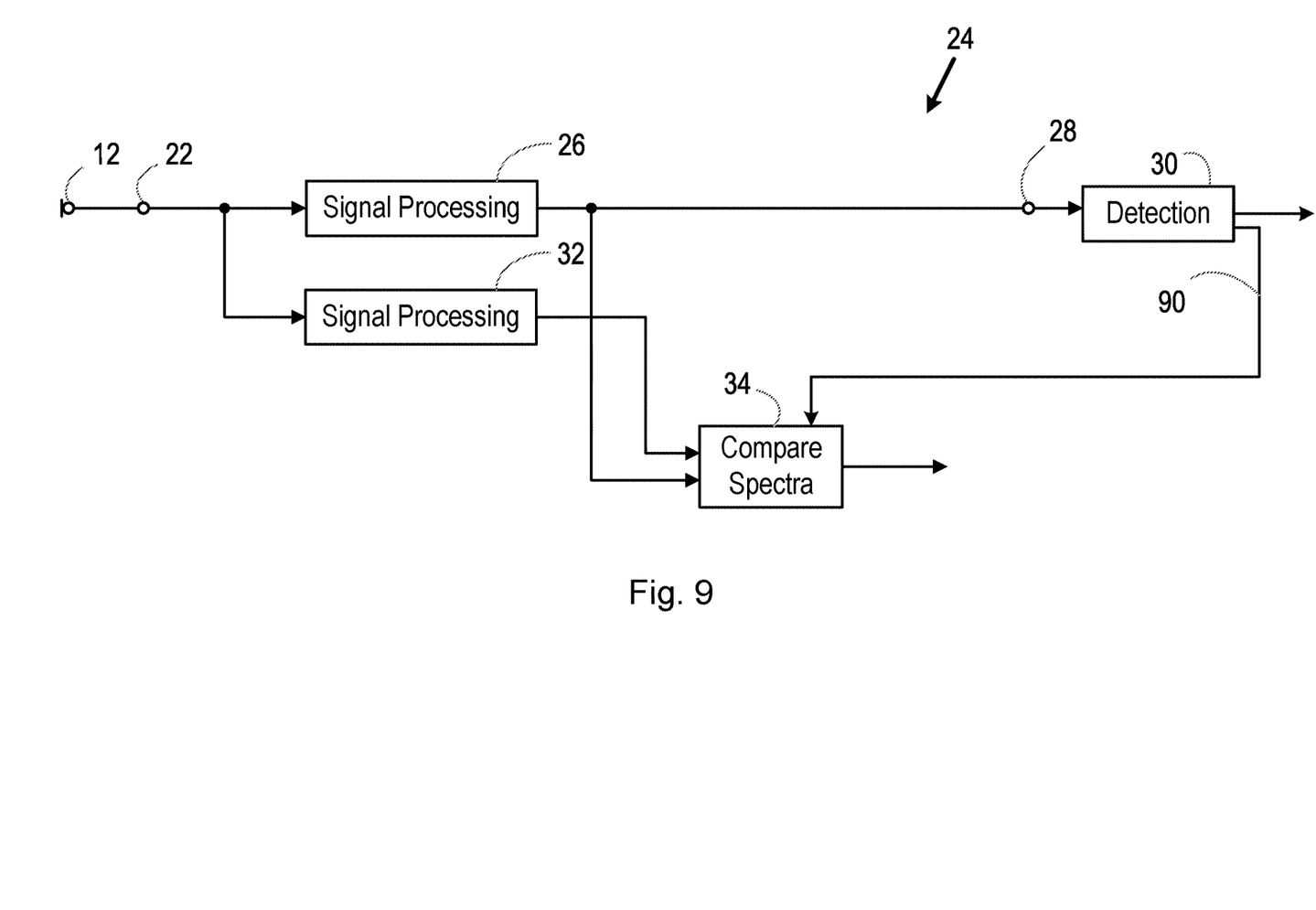
FIG. 9 is a block diagram, illustrating a part of an alternative audio signal processing system.

FIG. 9 illustrates an alternative embodiment of a part of an audio signal processing system. The system shown in FIG. 9 is generally the same as the system shown in FIG. 3, and parts of the system that are the same are indicated by the same reference numerals in FIG. 3 and FIG. 9. The operation of the system shown in FIG. 9 is generally the same as the operation of the system shown in FIG. 3, and the description thereof will not be repeated.

The system shown in FIG. 9 additionally includes a line 90 from the voice trigger detection block 30 to the comparison block 34.

In this alternative embodiment, the voice trigger detection block 30 sends a first signal to the comparison block 34 when the start of the predetermined trigger phrase is detected, and sends a second signal to the comparison block 34 when the end of the predetermined trigger phrase is detected.

Figure 10:
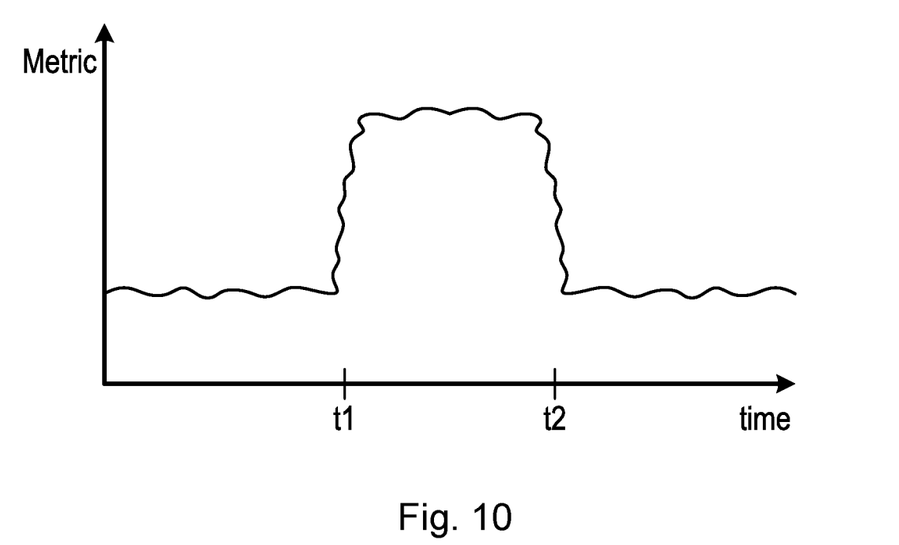
FIG. 10 illustrates a result obtained from the system of FIG. 8.

FIG. 10 shows one possible result of using the system of FIG. 9. Specifically, FIG. 10 shows the value over time of the metric that is used to indicate the difference between the input signals of the comparison block 34, i.e. the first output, from the first signal processing path 26, and the second output, from the second signal processing path 32. As described above, this metric might be a measure of the difference between the shapes of the signal power spectra in the two signal processing paths, or a difference between the levels of energy in one or more selected frequency band between the two signal processing paths, or a difference between the output scores of VTs or VADs connected to the two signal processing paths.

In the illustrative example shown in FIG. 10, the comparison block 34 receives the first signal, indicating the start of the predetermined trigger phrase, at the time t1, and receives the second signal, indicating the end of the predetermined trigger phrase, at the time t2. It can be seen that the value of the metric is significantly higher during the period between the times t1 and t2 that outside this period. This indicates that there is a correlation between the time during which the trigger detection block 30 is detecting the predetermined trigger phrase, and the time during which the comparison block is detecting the presence of an unwanted component in the received signal. In practice, a relatively instantaneous value of the metric during the period between the times t1 and t2 may be compared with a value before the time t1. Alternatively, a moving average value of the metric over a time window may be monitored and compared with a value before the time t1.

This may be characteristic of a replay attack, in which the attacker is generating a sound in the ultrasonic frequency range that is being downconverted into a signal that can be identified as representing the predetermined trigger phrase. Thus, when the specific criterion is met, any trigger phrase that was detected can be ignored. In addition, a warning signal may be provided to the user.

There are thus described systems in which an unwanted component of a received acoustic signal can be detected.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units.

A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A method for determining the presence of unwanted signal components in an acoustic signal, comprising:
  receiving a first microphone signal derived from an acoustic signal, applying the first microphone signal to a first signal processing path having a first transfer function to provide a first output, receiving a second microphone signal derived from the acoustic signal, applying the second microphone signal to a second signal processing path having a second transfer function to provide a second output, configuring the first and second signal processing paths such that the second transfer function has a greater linear range of operation than the first transfer function, and determining the presence of unwanted signal components in the acoustic signal based on a comparison of the first output and the second output, wherein the first and second signal processing paths each comprise an analog gain element and a digital gain element, and wherein configuring the first and second signal processing paths comprises setting total gain values of the first and second signal processing paths to be equal, and setting a gain value of the analog gain element in the first signal processing path to be higher than a gain value of the analog gain element in the second signal processing path.

2. A method according to claim 1, wherein the step of determining the presence of unwanted signal components in the acoustic signal comprises detecting signal components within the first output which are absent from the second output.

3. A method according to claim 1, wherein the step of determining the presence of unwanted signal components in the acoustic signal comprises detecting signal components within an audio band frequency range of the first output which are absent from the audio band frequency range of the second output.

4. A method according to claim 1, wherein the second transfer function has a greater linear range of operation than the first transfer function.

5. A method according to claim 1, wherein the first microphone signal and the second microphone signal are obtained from the same microphone input.

6. A method according to claim 1, wherein the first microphone signal and the second microphone signal are obtained from different microphone inputs.

7. A method for determining the presence of unwanted signal components in an acoustic signal, comprising:

receiving a first microphone signal derived from an acoustic signal, applying the first microphone signal to a first signal processing path having a first transfer function to provide a first output, receiving a second microphone signal derived from the acoustic signal, applying the second microphone signal to a second signal processing path having a second transfer function to provide a second output, configuring the first and second signal processing paths such that the second transfer function has a greater linear range of operation than the first transfer function, and determining the presence of unwanted signal components in the acoustic signal based on a comparison of the first output and the second output, wherein the first and second signal processing paths comprise at least one signal processing component having nonlinear characteristics, wherein configuring the first and second signal processing paths comprises adjusting the operation of at least one signal processing component having nonlinear characteristics.

8. A method according to claim 7, wherein the at least one signal processing component comprises an analog amplifier, and wherein configuring the first and second signal processing paths comprises adjusting a gain of the analog amplifier.

9. A method according to claim 7, wherein the at least one signal processing component comprises an analog-to-digital converter, and wherein configuring the first and second signal processing paths comprises adjusting a gain of the analog-to-digital converter.

10. A method for determining the presence of unwanted signal components in an acoustic signal, comprising:

receiving a first microphone signal derived from an acoustic signal, applying the first microphone signal to a first signal processing path having a first transfer function to provide a first output, receiving a second microphone signal derived from the acoustic signal, applying the second microphone signal to a second signal processing path having a second transfer function to provide a second output, configuring the first and second signal processing paths such that the second transfer function has a greater linear range of operation than the first transfer function, and determining the presence of unwanted signal components in the acoustic signal based on a comparison of the first output and the second output, wherein configuring the first and second signal processing paths comprises at least one of:

applying different supply voltages to the first and second signal processing paths; and applying a DC offset to one of the first and second signal processing paths.

11. An analog front end, comprising:

a first signal processing path for receiving a first microphone signal derived from an acoustic signal, wherein the first signal processing path has a first transfer function and provides a first output, a second signal processing path for receiving a second microphone signal derived from the acoustic signal, wherein the second signal processing path has a second transfer function and provides a second output, and a comparator for determining a presence of unwanted signal components in the acoustic signal based on a comparison of the first output and the second output;

wherein:

the first and second signal processing paths are configurable such that the second transfer function has a greater linear range of operation than the first transfer function; and the first and second signal processing paths each comprise an analog gain element and a digital gain element, and wherein the first and second signal processing paths are configurable by setting total gain values of the first and second signal processing paths to be equal, and setting a gain value of the analog gain element in the first signal processing path to be higher than a gain value of the analog gain element in the second signal processing path.

12. An analog front end according to claim 11, wherein the first microphone signal and the second microphone signal are obtained from the same microphone input.

13. An analog front end according to claim 11, wherein the first microphone signal and the second microphone signal are obtained from different microphone inputs.

14. An analog front end, comprising:
- a first signal processing path for receiving a first microphone signal derived from an acoustic signal, wherein the first signal processing path has a first transfer function and provides a first output,
- a second signal processing path for receiving a second microphone signal derived from the acoustic signal, wherein the second signal processing path has a second transfer function and provides a second output, and
- a comparator for determining a presence of unwanted signal components in the acoustic signal based on a comparison of the first output and the second output;

wherein:
- the first and second signal processing paths are configurable such that the second transfer function has a greater linear range of operation than the first transfer function; and
- the first and second signal processing paths comprise at least one signal processing component having nonlinear characteristics, wherein configuring the first and second signal processing paths comprises adjusting the operation of at least one signal processing component having nonlinear characteristics.

15. An analog front end according to claim 14, wherein the at least one signal processing component comprises an analog amplifier, and wherein configuring the first and second signal processing paths comprises adjusting a gain of the analog amplifier.

16. An analog front end according to claim 14, wherein the at least one signal processing component comprises an analog-to-digital converter, and wherein configuring the first and second signal processing paths comprises adjusting a gain of the analog-to-digital converter.

17. An analog front end, comprising:
- a first signal processing path for receiving a first microphone signal derived from an acoustic signal, wherein the first signal processing path has a first transfer function and provides a first output,
- a second signal processing path for receiving a second microphone signal derived from the acoustic signal, wherein the second signal processing path has a second transfer function and provides a second output, and
- a comparator for determining a presence of unwanted signal components in the acoustic signal based on a comparison of the first output and the second output;

wherein:
- the first and second signal processing paths are configurable such that the second transfer function has a greater linear range of operation than the first transfer function; and
- configuring the first and second signal processing paths comprises at least one of:
    - applying different supply voltages to the first and second signal processing paths; and
    - applying a DC offset to one of the first and second signal processing paths.

* * * * *